Figure 1:
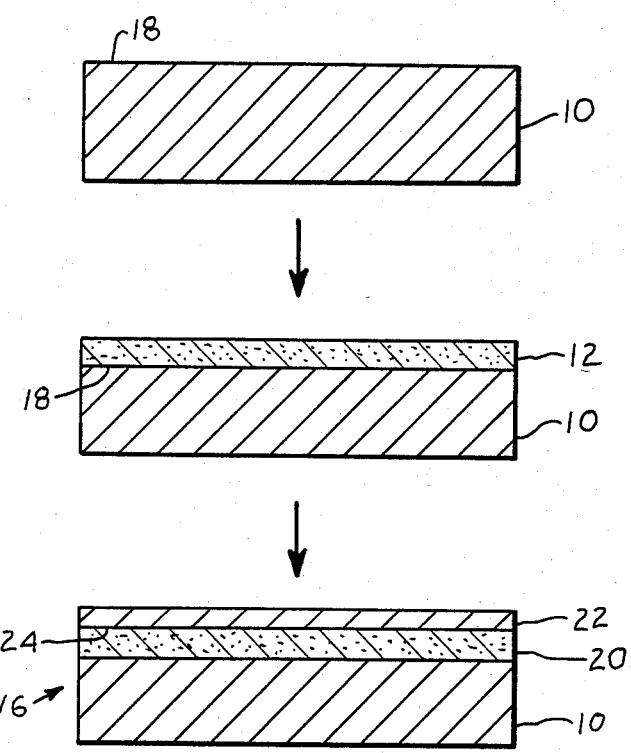

United States Patent [19]

Fister et al.

[11] Patent Number: 4,500,605

[45] Date of Patent: Feb. 19, 1985

[54] ELECTRICAL COMPONENT FORMING PROCESS

[75] Inventors: Julius C. Fister, Hamden; John F. Breedis, Trumbull, both of Conn.

[73] Assignee: Olin Corporation, New Haven, Conn.

[21] Appl. No.: 467,616

[22] Filed: Feb. 17, 1983

[51] Int. Cl.$^3$ .................. C23C 11/00; C23C 11/10
[52] U.S. Cl. ................... 428/469; 148/6.31; 148/6.35; 148/6.3; 148/13.1; 148/13.2; 148/20.3; 428/629; 428/652
[58] Field of Search ............. 148/6.31, 6.35, 13.1, 148/13.2, 16, 6.3, 20.3; 428/469, 629, 652

[56] References Cited

U.S. PATENT DOCUMENTS

| | | | |
|---|---|---|---|
| 1,156,170 | 10/1915 | Page | 148/6.35 |
| 1,851,573 | 3/1932 | Elsey | 148/6.3 |
| 3,259,526 | 7/1966 | Walker et al. | 148/6.35 |
| 3,341,369 | 9/1967 | Caule et al. | 148/3 |
| 3,345,218 | 10/1967 | Brookover et al. | 148/6.3 |
| 3,475,227 | 10/1969 | Caule et al. | 148/6.31 |
| 3,546,363 | 12/1970 | Pryor et al. | 174/52 |
| 3,618,203 | 11/1971 | Pryor | 29/588 |
| 3,676,292 | 7/1972 | Pryor et al. | 174/50.56 |
| 3,698,964 | 10/1972 | Caule et al. | 148/31.5 |
| 3,726,987 | 4/1973 | Pryor et al. | 174/50.61 |
| 3,730,779 | 5/1973 | Caule et al. | 148/6.35 |
| 3,810,754 | 5/1974 | Ford et al. | 75/171 |
| 3,826,627 | 7/1974 | Pryor et al. | 29/195 |
| 3,826,629 | 7/1974 | Pryor et al. | 29/195 |
| 3,837,895 | 9/1974 | Pryor et al. | 427/409 |
| 3,852,148 | 12/1974 | Pryor et al. | 52/235 |
| 3,906,125 | 9/1975 | Uher | 148/6.35 |
| 3,925,579 | 12/1975 | Finchum | 148/6.35 |
| 4,149,910 | 4/1979 | Popplewell | 148/6.35 |
| 4,189,331 | 2/1980 | Roy | 148/6.31 |
| 4,229,234 | 10/1980 | Krutenat et al. | 148/6.35 |
| 4,361,445 | 11/1982 | Pryor et al. | 134/3 |

OTHER PUBLICATIONS

Lassen, "Use of Metal Core Substrates for Leadless Chip Carrier Interconnection", *Electronic Packaging and Production*, Mar. 1981, pp. 98–103.

Lyman, "Chip-Carriers, Pin–Grid Arrays Change the PC-Board Landscape", *Electronics*, Dec. 29, 1981, pp. 67–75.

Dance et al., "Clad Metal Circuit Board Substrates for Direct Mounting of Ceramic Chip Carriers", presented at the First Annual Conference of the International Electronics Packaging Society, Cleveland, Ohio, 1981.

Erickson, "Chip Carriers: Coming Force In Packaging", *Electronic Packaging and Production*, Mar. 1981, pp. 64–80.

*Primary Examiner*—Norman Morgenstern
*Assistant Examiner*—Janyce A. Bell
*Attorney, Agent, or Firm*—Howard M. Cohn; Barry L. Kelmachter; Paul Weinstein

[57] ABSTRACT

The process of forming a composite with an alloy having an alloy component of about 0.5 to 12% aluminum and a matrix selected from a material of the group consisting of copper, iron or nickel. The alloy is heated in an oxygen-rich atmosphere to form a material oxide-rich layer on a surface of the alloy. The alloy is then heated in a reducing atmosphere to reduce the material oxide-rich layer to form an aluminum oxide on the surface of the alloy and a material-rich layer on the aluminum oxide layer.

15 Claims, 2 Drawing Figures

ELECTRICAL COMPONENT FORMING PROCESS

While the invention is subject to a wide range of applications, it is especially suited for use in circuit board and chip carrier applications and will be particularly described in those connections.

The electronic industry produces most printed circuits by adhering one or more layers of copper foil to organic materials such as glass fiber reinforced epoxy, phenolic laminated paper, polyester films, polyimide films, etc. Although widely used, these structures have certain deficiencies. Firstly, their maximum operating temperature is restricted by the maximum temperature tolerance of the organic substrate used. Secondly, a substantial mismatch usually exists between the generally higher coefficient of thermal expansion of the organic substrate as compared to the lower one of the copper foil, the solder compositions normally used to attach components to the circuitry and the components themselves. This mismatch may result in substantial "thermal stresses" whenever the finished product is thermally cycled. These stresses create a variety of failure modes, such as tensile failure of the copper foil, failure of the solder attachment of components to the circuit and tensile failure of the components themselves.

To alleviate some of the problems associated with thermal stress, the industry uses two distinct types of metal core boards. One is an epoxy or other organic insulation over a metal core (either steel or aluminum), and the other is porcelain enameled steel.

The most popular is the metal core-organic type boards. Typically, the metal core, such as 0.050" thick aluminum, is drilled with oversized holes. The holes are filled with the epoxy to match the epoxy coating on the core. Copper foil is then bonded to one or both surfaces of the core and the holes are redrilled leaving a liner of epoxy (or other organic) in each hole. The finished metal core board compares to and may be processed as a standard plastic board. The metal core board provides better heat dissipation as compared to the rather poor thermal conductivity of the glass fiber reinforced epoxy type boards.

The second type of board, porcelain enameled steel, is considered either a metal core board or a metal clad board depending on the terminology. The construction requires first applying porcelain enamel (essentially a glassy material) to a sheet of steel. A circuit pattern is then screen printed on the surface of the porcelain enamel with one of the thick film "conductive inks". Next, the board is refired to create a continuous pattern of metallic conductive elements. Through-holes cannot be used due to problems with short circuiting and, therefore, multilayer boards are generally not manufactured in this manner. The porcelain is rather thick and its thermal conductivity is relatively poor; in fact, it is even poorer than the thermal conductivity of plastics used in plastic boards or as a coating in metal core boards described above. It follows that the heat dissipation characteristics of the porcelain board are relatively poor.

Many of the above-mentioned considerations regarding clad metal are described in a paper entitled "Clad Metal Circuit Board Substrates for Direct Mounting of Ceramic Chip Carriers" by Dance and Wallace and presented at the First Annual Conference of the International Electronics Packaging Society, Cleveland, Ohio, 1981. Also, an article entitled "Use of Metal Core Substrates for Leadless Chip Carrier Interconnection" by Lassen in *Electronic Packaging and Production*, March 1981, pages 98–103, discusses the latest technology in metal core substrates.

Presently, copper foil is adhered to an organic printed circuit substrate by electrodeposition of "coral copper" to the foil surface. The result is a rough surface with re-entrance cavities to receive the surface layer of the organic substrate and/or the organic adhesive to form a "locked" mechanical bond. Since the surface layer is a conductive metal structure (copper) embedded in the organic material, considerable care must be exercised to remove any residual coral copper treatment from the spaces between the final printed circuit lines. This avoids unwanted current passing between lines, bridging of solder across the space between lines, etc. In principal, removal of residual coral copper treatment from areas requires additional etching beyond that required to remove the base foil itself. This excessive etching leads to additional undercutting and partial destruction of the circuit pattern. Thus, the manufacturer of conventional copper foil-organic circuit boards must strike a balance between enough etching to reliably remove the coral copper treatment while minimizing excessive etching to prevent undercutting of the circuit pattern.

The increased complexity of circuitry for interconnecting various devices mounted upon a printed circuit board often requires that both surfaces of the board contain conductive patterns. Some of the interconnections are provided by the circuit pattern on the obverse face of the board (the surface to which the components are mounted), while other interconnections are provided upon the reverse side of the board. The interconnection between the obverse and reverse sides of the board may be provided by solder filled through-holes. Conventional two sided copper foil-organic boards of this general configuration are widely used.

As integrated circuits become larger (more individual functions on a single silicon chip), and there is a corresponding increase in the number of leads for interconnection, the principal means of integrated circuit interconnection, the dual-in-line (DIP) package becomes impractical. For reasons relating to geometry, as the packages become longer with more pins, they become wider. Typically, the width of the completed package is approximately one-third its length. For both mechanical and electronic reasons, DIP packages with more than 64 leads are considered impractical to manufacture. However, large-scale integrated circuits often require more interconnections than provided by DIP packages. Even with smaller integrated circuits, the circuits are spaced together on the printed circuit board as closely as possible. Obviously, the package size limits the closeness of the spacing. Therefore, the semiconductor industry has a growing interest in "chip carriers".

Chip carriers deal with the problems of large-scale circuits requiring more interconnections than provided by a DIP package as well as reduction of package size for intermediate sized integrated circuits to increase component density on the printed circuit board. The term chip carrier, in its broadest sense, relates to packages, both ceramic and plastic. The configuration of a chip carrier may be essentially square and leads emerge from within the package on all four sides.

A description of the latest technology with respect to chip carriers is presented in an article entitled "Chip- Carriers, Pin Grid Arrays Change the PC-Board Landscape" by Jerry Lyman, *Electronics*, Dec. 29, 1981, pages 67–75. Another article entitled "Chip Carriers: Coming Force in Packaging" by Erickson, in *Electronic Packaging and Production*, March 1981, pages 64–80 discusses the construction and other details concerning chip carriers.

U.S. Pat. Nos. 3,546,363; 3,618,203; 3,676,292; 3,726,987; 3,826,627; 3,826,629; 3,837,895; 3,852,148; and 4,149,910 disclose glass or ceramic to metal composites or seals wherein the glass or ceramic is bonded to a base alloy having a thin film of refractory oxide on its surface.

U.S. application Ser. Nos. 369,999, 369,785 and 390,081 to S. H. Butt and assigned to the assignee of the present invention disclose improved printed circuit boards and chip carriers which can accommodate substantial thermal cycling and provide improved heat dissipation.

It is a problem underlying the present invention to provide a process for forming an electrical component which can be used for devices such as chip carriers and circuit boards.

It is an advantage of the present invention to provide a process for forming an electrical component which obviates one or more of the limitations and disadvantages of the described prior arrangements.

It is a further advantage of the present invention to provide a process for forming an electrical component which substantially reduces the formation of stresses due to thermal cycling.

It is a still further advantage of the present invention to provide a process for forming an electrical component which provides high thermal conductivity characteristics.

It is a yet further advantage of the present invention to provide an electrical component which has excellent mechanical strength properties.

It is a still further advantage of the present invention to provide a process for forming an electrical component which is relatively inexpensive to manufacture.

Accordingly, there has been provided the process of forming an electrical component from an alloy having an alloy component of about 0.5 to 12% aluminum and a matrix selected from a material of the group consisting of copper, iron or nickel. The alloy is heated in an oxygen-rich atmosphere to form a material oxide-rich layer on a surface of the alloy. The alloy is then heated in a reducing atmosphere to reduce the material oxide-rich layer to form an aluminum oxide layer on the surface of the alloy and a material-rich layer on the aluminum oxide layer.

Figure 2:
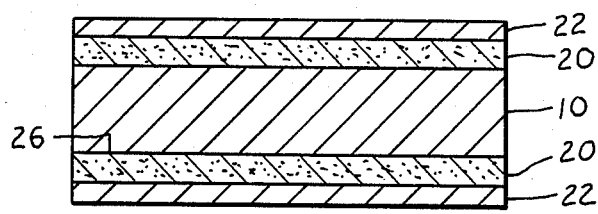

The invention and further developments of the invention are now elucidated by means of the preferred embodiments shown in the drawings:

FIG. 1 is a cross section of a composite which is processed in accordance with the present invention; and FIG. 2 is a cross section of a multi-layer composite in accordance with the present invention.

The present invention is directed to a process for forming a composite 16. First, an alloy 10 comprising a first alloy component of about 0.5 to 12% aluminum and the matrix selected from a material of the group consisting of copper, iron or nickel is provided. Then, the alloy 10 is heated in an oxygen-rich atmosphere to form a material oxide-rich layer 12 on a surface 18 of the alloy 10. Finally, the alloy 10 is heated in a reducing atmosphere to reduce the material oxide-rich layer 12 and form an aluminum oxide layer 20 on the surface of the alloy and a material-rich layer 22 on a surface 24 of the aluminum oxide layer.

The preferred alloy for use in the embodiments of the present invention is a copper base alloy containing from about 0.5 to 12% aluminum and the balance copper. Preferably, the alloy contains from 2 to 10% aluminum, 0.001 to 6% silicon and if desired, a dispersion forming element selected from the group consisting of iron up to 4.5%, chromium up to 1%, zirconium up to 0.5%, cobalt up to 1% and mixtures of these grain refining elements and the balance copper. In particular, CDA alloy C6381, as described in U.S. Pat. Nos. 3,341,369 and 3,475,227 to Caule et al., containing 2.5 to 3.1% aluminum, 1.5 to 2.1% silicon, and the balance copper is useful as a substrate for this invention. Impurities may be present which do not prevent bonding in a desired environment.

The present invention is not restricted to applications of alloy C6381 but includes the broad field of metals or alloys which have the ability to form a conductor layer separated by a continuous refractory oxide layer. Several examples of other metal alloys such as nickel base and iron base alloys are disclosed in U.S. Pat. Nos. 3,698,964, 3,730,779 and 3,810,754. Alloy C6381 is particularly suitable for this invention because it is a commercial alloy which forms the desired composite when processed as described herein. The metal or alloy substrate may also include composite metals in which either the conductor layer or metal or alloy substrate is clad upon another metal by any conventional technique. This other metal may be another copper alloy or any other metal whose bulk properties are desired for a specific application.

The process disclosed herein begins with preferably cleaning the selected alloy from any impurities in accordance with any desired technique such as for example, the cleaning process taught in U.S. Pat. No. 4,361,445 to Pryor et al. The latter cleaning process begins with immersing the article to be cleaned in a stirred aqueous alkaline solution, as of sodium, potassium or lithium hydroxide, having a pH above 10, for at least 2 seconds at a temperature between about 40° C. and the boiling point. After draining and rinsing the article with water, it is submerged in a stirred aqueous solution of ferric sulfate or similar ferric salt of a mineral acid having a concentration of about 0.5 to 3.0N. The material is submerged in the ferric sulfate for about 5 to 60 seconds at a temperature of about 25° to 95° C. and preferably 60° to 90° C. Each step of the process should be followed by draining the solution from the article or subjecting it to blowing with airstreams and removing the residual solution by rinsing with water. The particular cleaning technique for removing the outer film on the surface of the alloy is not a part of the present invention and, therefore, any other desired cleaning technique may be used in place of the techniques set out hereinabove.

The alloy is next annealed in an oxidizing environment, such as air, at a temperature of below about 500° C. for a period of less than about 10 hours. The oxidizing atmosphere may be in the range of 0.1% to 100% oxygen but is preferably in the range of 1% to 25% oxygen. Further, the preferred temperature range for the annealing is between about 200° and 350° C. at a preferred time of about 1 to 2 hours.

The process of heating the alloy in an oxidizing atmosphere results in the formation of a copper-rich layer 12 which is primarily copper oxide but may include other material such as copper aluminate. This copper oxide is a combination of cupric oxide and cuprous oxide although for purposes of this invention, they are collectively considered to be copper oxide. The thickness of the copper-rich layer is determined according to the desired thickness of the final copper-rich conductor layer 22 described hereinbelow.

The copper alloy with the copper oxide-rich layer is now heated in a reducing atmosphere to reduce the copper oxide layer 12 and to form an aluminum oxide layer 20 on the surface 18 of the alloy and a copper-rich conductor layer 22 on the aluminum oxide layer 20. The alloy is subjected to a reducing atmosphere at a temperature of between approximately 500° to 850° C. and optimally in the preferred range of from about 600° to 800° C. The time of holding the alloy at this elevated temperature should be for practical purposes less than 2 days, although longer heating times may be utilized if desired. The optimum heating time is from about 1 hour to 10 hours.

The annealing is preferably performed in a wet reducing atmosphere of approximately 96% $N_2$+4% $H_2$. Since the temperature is approximately 600° to 800° C., the copper oxide is in an unstable condition and cannot stay in the same state or form more copper oxide. Therefore, the copper oxide begins to reduce into a layer of substantially copper oxide plus pure copper. Simultaneous with this reaction, oxygen from the environment is able to diffuse through the copper oxide and copper layer and interact with the substrate to form a layer 20 of aluminum oxide. The oxygen primarily interacts with the aluminum because the oxygen potential or thermodynamics of the reaction is not favorable for the formation of copper oxide. As the process continues, the top layer 22 becomes copper-rich to an extent that it is a good electrical conductor while the aluminum oxide layer 20 becomes thick enough to be an electrical insulator. This thickness is thought to be more than 100 Å although it may be thinner if desired.

The composite 16 of a copper alloy substrate 10 having an aluminum oxide insulator 20 sandwiched between a surface 18 of the substrate and a copper-rich conductor layer 22 has many potential uses for electronic devices. For example, this article may provide an excellent alternative to the prior art printed circuit boards by simply etching a circuit into the conductor layer 22. A printed circuit board of this construction would have the advantages of being very durable, not being subject to stresses from thermal cycling, having high thermal conductivity characteristics and being relatively inexpensive to manufacture.

The article 16 may also be adapted to provide a chip carrier which has the advantages as set forth above with regard to printed circuit. Other uses of this article, not enumerated herein, may be adapted to by direct application or slight modification of the herein described article.

The process of the present invention has primarily been describing the formation of conductor and insulator layers on one surface of a substrate 10. However, as shown in FIG. 2, it is also within the terms and scope of the present invention to form the same conductor and insulator layers on a second surface 26 of the substrate 10.

The patents, patent applications and publications set forth in this application are intended to be incorporated by reference herein.

It is apparent that there has been provided in accordance with this invention a composite and a process for forming the composite which satisfies the objects, means, and advantages set forth hereinabove, While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. The process of forming a composite, comprising the steps of:
   (a) providing an alloy comprising a first alloy component of about 0.5 to 12% aluminum and the balance being selected from a material from the group consisting of copper, iron or nickel;
   (b) heating said alloy at a temperature below about 350° C. in an oxygen-rich atmosphere to form an oxide layer of said material on a surface of said alloy; and
   (c) heating said alloy at a temperature between approximately 500° to 850° C. in a reducing atmosphere to reduce said oxide layer of said material into a layer of said material and to simultaneously form an aluminum oxide layer between said layer of said material and the surface of said alloy.

2. The process of claim 1 further including the step of providing said alloy with a second alloy component comprising about 0.001 to 6% silicon.

3. The process of claim 2 wherein said material is copper.

4. The process of claim 3 wherein said first alloy component comprises 2.5 to 3.1% aluminum and said second alloy component comprises 1.5 to 2.1% silicon.

5. The process of claim 4 wherein the step of heating said alloy occurs in an oxygen-rich atmosphere for a period of time of less than about 10 hours.

6. The process of claim 5 wherein said reducing atmosphere is a wet reducing atmosphere including about 96% $N_2$+4% $H_2$.

7. The process of claim 6 further including the step of cleaning said alloy prior to heating said alloy in an oxygen-rich atmosphere.

8. The process of claim 7 wherein the alloy is reduced in said wet reducing atmosphere until the aluminum oxide is more than about 100 Å thick.

9. The process of claim 1 wherein said material is iron.

10. The process of claim 1 wherein said material is nickel.

11. An article of manufacture formed by the process of claim 10.

12. The process of claim 1 wherein said step of heating said alloy in an oxygen reducing atmosphere includes forming a second oxide layer on a second surface of said alloy; and said step of heating said alloy in a reducing atmosphere includes reducing said second oxide layer of said material onto a second layer of said material and to simultaneously form a second aluminum oxide layer between said second layer of said material and the surface of said alloy.

13. As an article of manufacture, the product formed by the process of claim 12.

14. The process of forming a composite, comprising the steps of:

(a) providing an alloy comprising a first alloy component of about 0.5 to 12% aluminum and the balance being selected from a material from the group consisting of copper, iron or nickel;
(b) heating said alloy at a temperature below about 350° C. in an oxygen-rich atmosphere to form an oxide layer of said material on a surface of said alloy; and
(c) heating said alloy at a temperature above about 500° C. in a reducing atmosphere to reduce said oxide layer of said material into a layer of said material and to simultaneously form an aluminum oxide layer between said layer of said material and the surface of said alloy.

15. The process of forming a composite, comprising the steps of:
    (a) providing an alloy comprising a first alloy component of about 0.5 to 12% aluminum and the balance being selected from nickel;
    (b) heating said alloy at a temperature below about 350° C. in an oxygen rich atmosphere to form an oxide layer of said nickel on a surface of said alloy; and
    (c) heating said alloy at a temperature above about 500° C. in a reducing atmosphere to reduce said oxide layer of said nickel into a layer of said nickel and to simultaneously form an aluminum oxide layer between said layer of said nickel and the surface of said alloy.

* * * * *